United States Patent [19]
Moslehi

[11] Patent Number: 5,489,550
[45] Date of Patent: Feb. 6, 1996

[54] GAS-PHASE DOPING METHOD USING GERMANIUM-CONTAINING ADDITIVE

[75] Inventor: Mehrdad M. Moslehi, Los Altos, Calif.

[73] Assignee: Texas Instruments Incorporated, Dallas, Tex.

[21] Appl. No.: 287,570

[22] Filed: Aug. 9, 1994

[51] Int. Cl.[6] .................................................. H01L 21/223
[52] U.S. Cl. .................. 437/165; 437/950; 148/DIG. 58
[58] Field of Search ................................. 437/165, 166, 437/950; 148/DIG. 58, DIG. 59, DIG. 144

[56] References Cited

U.S. PATENT DOCUMENTS

| | | | |
|---|---|---|---|
| 4,504,331 | 3/1985 | Kuech et al. | 437/971 |
| 4,618,381 | 10/1986 | Sato et al. | 437/81 |
| 4,698,104 | 10/1987 | Barker et al. | 437/141 |
| 4,830,982 | 5/1989 | Dentai et al. | 437/94 |
| 4,904,616 | 2/1990 | Bohling et al. | 437/81 |
| 4,988,640 | 1/1991 | Bohling et al. | 437/81 |
| 5,015,747 | 5/1991 | Hostalek et al. | 556/1 |
| 5,128,275 | 7/1992 | Takikawa et al. | 437/81 |
| 5,156,461 | 10/1992 | Moslehi et al. | 374/121 |
| 5,242,847 | 9/1993 | Ozturk et al. | 148/DIG. 58 |
| 5,242,859 | 9/1993 | Degelormo et al. | 437/165 |
| 5,275,966 | 1/1994 | Gedridge, Jr. | 437/81 |
| 5,293,216 | 3/1994 | Moslehi | 356/371 |
| 5,300,185 | 4/1994 | Hori et al. | 158/610 |
| 5,316,958 | 5/1994 | Meyerson | 437/950 |

OTHER PUBLICATIONS

C. M. Ransom, T. N. Jackson, J. F. DeGelormo, C. Zeller, D. E. Kotecki, C. Graimann, D. K. Sadana and J. Benedict, "Shallow n+ Junctions in Silicon By Arsenic Gas–Phase Doping", J. Electrochem. Soc., vol. 141, No. 5, pp. 1378–1381, May, 1994.

J. Nishizawa, K. Aoki and T. Akamine, "Ultrashallow, High Doping of Boron Using Molecular Layer Doping", Appl. Phys. Lett., vol. 56, No. 14, 2 Apr. 1990, pp. 1334–1335.

Yukihiro Kiyota, Tohru Nakamura, Taroh Inada, Atsushi Kuranouchi and Yasuaki Hirano, "Characteristics of Shallow Boron–Doped Layers in Si by Rapid Vapor–Phase Direct Doping", J. Electrochem. Soc., vol. 140, No. 4, pp. 1117–1121, Apr., 1993.

Mehrdad M. Moslehi, Cecil David and Allen Bowling, "Microelectronics Manufacturing Science and Technology: Single–Wafer Thermal Processing and Wafer Cleaning", TI Technical Journal, Sep.–Oct. 1992, pp. 44–52.

*Primary Examiner*—Chandra Chaudhari
*Attorney, Agent, or Firm*—Kay Houston; James W. Brady; Richard L. Donaldson

[57] ABSTRACT

A germanium-containing compound may be used as an additive to dopant source gas to improve the direct GPD (Gas-Phase Doping) processes. This invention involves a gas-phase doping method for semiconductor wafers, including the steps of providing a semiconductor wafer, and exposing the surface of the wafer to a process medium comprising a dopant gas in order to dope the surface of the wafer, wherein the process medium also comprises a germanium-containing compound gas. Preferably, the process medium also comprises a carrier gas, where the carrier gas is hydrogen. The germanium-containing gas can be germane, digermane, or other suitable germanium-containing compound. The wafer and dopant gas may also be exposed to a plasma source, and the wafer may be heated in a rapid thermal processing reactor. Some advantages over conventional GPD processes include faster desorption of byproducts and incorporation of dopant atoms, shallower junctions, shorter cycle times, and lower processing temperatures.

34 Claims, 2 Drawing Sheets

GAS-PHASE DOPING METHOD USING GERMANIUM-CONTAINING ADDITIVE

CROSS-REFERENCE TO RELATED APPLICATIONS

U.S. patent application Ser. No. 08/283,979, TI case TI8197, entitled Method for Doped Shallow Junction Formation Using Direct Gas-Phase Doping, filed on Aug. 1, 1994 by Moslehi.

FIELD OF THE INVENTION

This invention relates generally to the field of microelectronics and integrated circuits, and more particularly to a direct gas-phase doping (GPD) fabrication process for formation of shallow doped device junctions in semiconductor layers and substrates.

BACKGROUND OF THE INVENTION

Semiconductors are widely used in integrated circuits for electronic applications, including various information systems. Such integrated circuits typically use multiple bipolar junction transistors (BJT) and/or metal-oxide semiconductor field-effect transistors (MOSFET) fabricated in single crystal silicon. Many integrated circuits now require the introduction of dopants to one or more device junction layers for formation of the transistor device structures. Usually when dopants are introduced into a semiconductor wafer surface, they are introduced by a process called ion implantation, wherein the substrate is bombarded by ions of a certain species, thus introducing the dopant.

A significant requirement in sub-half-micrometer, high-performance semiconductor technologies is junction depth reduction (e.g., CMOS source/drain, bipolar emitter, and base) to suppress MOS punch-through leakage and to minimize device short-channel effects. Device junctions with relatively high surface dopant concentrations, ultra-shallow depths (below 1000 Å), low contact and sheet resistances, and low junction leakage currents will be critical for advanced sub-quarter-micrometer semiconductor technologies.

One problem with the ion implantation process is that the semiconductor crystal structure is damaged and later, a high temperature thermal anneal process must be performed in order to remove the defects. Another problem is that there is a limit on the shallowness of the doped junctions. In order to achieve junctions with depths on the order of 1000 Å or less, alternative device doping methods must be utilized.

Alternative methods of doping include direct gas-phase doping (GPD) such as rapid thermal gas-phase doping (RTGPD) and plasma immersion ion implantation (PIII), which allow the formation of ultra-shallow junctions without the use of conventional ion implantation. Prior art GPD processes usually have employed an ambient consisting of diborane mixed with hydrogen ($B_2H_6/H_2$) for p-type doping, to form ultra-shallow boron junctions; or phosphine mixed with hydrogen ($PH_3/H_2$) for n-type doping, to form ultra-shallow phosphorus doped junctions. Moreover, both arsine ($AsH_3$) and tertiarybutylarsine (TBA) have been used in GPD processes to form shallow arsenic-doped junctions. The GPD processes rely on the chemisorption of the dopant species followed by thermally activated surface dissociation of the dopant species and solid-state diffusion to form the doped junction. The GPD process usually consists of a native oxide removal process step prior to the formation of an adsorbed dopant layer on the silicon surface and subsequent solid-phase diffusion of dopants from the adsorbed layer into the silicon substrate. Dopants are incorporated into silicon by diffusion in an oxygen-free atmosphere at a relatively low temperature unlike the conventional diffusion process in which dopant diffusion is performed in an oxygen-rich ambient.

The GPD process involves species such as hydrogen, phosphine, diborane, or arsine. The dopant molecules are adsorbed on the semiconductor surface. After surface adsorption, dissociation occurs; the chemical bonds between hydrogen and the dopant atoms break, reducing the adsorbed molecules into arsenic, phosphorous, or boron atoms, which diffuse into the silicon substrate. The byproducts, e.g. hydrogen, then desorb from the surface to make the surface sites available for chemical adsorption of more dopant species.

Reduced junction depths are required in scaled-down semiconductor technologies. For instance, the source/drain junction depth must be reduced with each new IC technology generation. In general, the need for reduced junction depth is driven by the device scale-down and improved device performance. Conventional doping methods have shortcomings: the ion implantation processes and current GPD processes have limitations in terms of minimum junction depth and junction quality.

Ion implantation technology has been widely used in semiconductor device manufacturing because of its superior controllability and relatively high manufacturing throughput, but it is inadequate for junctions shallower than 1000 Å because of ion channeling at low ion energies, end-of-range implant damage, lateral dopant spreading, and poor throughput and process control at low implant energies (e.g. below 10 keV). Another limitation of the implantation-formed junctions is the so-called anomalous transient-enhanced boron diffusion during low-temperature thermal annealing caused by the thermal dissolution of small defect clusters produced by ion implantation. Moreover, ion implantation is not suitable for uniform doping of high-aspect-ratio trenches. Effective removal of the implantation-induced defects in Si requires relatively high thermal annealing temperatures, which further redistribute the dopant.

The GPD processes to date have been exclusively based on the $B_2H_6/H_2$ (for p type), $PH_3/H_2$ (for n type), and $AsH_3/H_2$ (for n type) chemistries. These processes do not produce any damage in silicon and are the most effective when the semiconductor surface is treated using an in-situ clean to remove any native oxide layer.

SUMMARY OF THE INVENTION

The present invention encompasses adding a germanium-containing gas to the process ambient gas during GPD (Gas-Phase Doping). The use of a germanium-containing additive accelerates desorption of doping reaction byproducts and incorporation of dopant atoms into the semiconductor substrate surface. This invention results in formation of ultrashallow doped junctions using low thermal budget processes.

This invention involves a gas-phase doping method for semiconductor wafers, including the steps of providing a semiconductor wafer, and exposing the surface of the wafer to a process medium comprising a dopant-containing gas in order to dope the surface of the wafer, wherein the process medium also comprises a germanium-containing gas. Preferably, the GPD process medium also comprises a carrier gas, where the carrier gas is hydrogen. The germanium-containing gas may be germane, digermane, or another suitable germanium compound, preferably in the amount of less than 1000 ppm, and more preferably in the amount of 10–20 ppm. The wafer and dopant gas may also be exposed to a plasma source, and the wafer may be heated.

Some advantages of the invention can include the ability to increase the dopant introduction rate into exposed silicon regions, resulting in an increased doping process throughput rate, and the ability to reduce the temperature and/or time of the process and make the doped junction even shallower for a given surface concentration. With this invention, the junction depth can be reduced, yet still be heavily doped. Another advantage is increased doped junction surface concentration with reduced doping process thermal budget.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of a preferred embodiments and alternative embodiments. Corresponding numerals and symbols in the different figures refer to corresponding parts unless otherwise indicated. Table 1 below provides an overview of the elements of the embodiments and the drawings.

TABLE 1

| Drawing Element | Generic Term | Specific Examples or Alternates |
| --- | --- | --- |
| 10 | Semiconductor device | Metal-Oxide Field-Effect Transistor or MOSFET |
| 12 | Field oxide | |
| 14 | Polysilicon gate | |
| 16 | Sidewall spacer | Oxide sidewall spacer |
| 18 | Substrate | Silicon substrate |
| 20 | p+portion of substrate | |

TABLE 1-continued

| Drawing Element | Generic Term | Specific Examples or Alternates |
| --- | --- | --- |
| 22 | Gate dielectric | Gate oxide |
| 38 | Semiconductor wafer | |
| 50 | Single-wafer rapid thermal processing (RTP) reactor | Automated Vacuum Processor (AVP) |
| 52 | Gas Distribution Network | Gas Distribution Network with 2 gas Manifolds; a non-plasma and a plasma manifold |
| 54 | Gas line | Nonplasma gas line |
| 56 | Reactor casing | |
| 58 | Chamber wall | Process chamber wall |
| 60 | Pin support plate | |
| 62 | Gas Injecter | |
| 64 | Plasma line | |
| 66 | Connection | |
| 68 | Microwave discharge cavity | |
| 70 | Plasma tube | Quartz tube |
| 72 | Process chamber | |
| 74 | Plasma output | |
| 76 | Quartz jacket assembly | |
| 78 | Low thermal mass pins | |
| 80 | Optical quartz window | |
| 84 | Multi-zone illuminator assembly | Tungsten-halogen lamp assembly; lamp |
| 86 | Vacuum pump connection | |
| 88 | Pumping package | |
| 90 | Isolation gate | |
| 92 | Vacuum load-lock chamber | |
| 94 | Vertically moveable bellows | Up/down actuator mechanism |
| 96 | Cassette | |
| 98 | Wafer handling robot | |
| 100 | Vacuum pump connection | |
| 102 | Scatter sensor | Fiber-optic scatter sensor |
| 104 | Process control computer | |
| 106 | Temperature controller | Multi-zone Controller |
| 108 | Lamp power supply module | Multi-zone illuminator assembly power supply |
| 110 | Signal lines | Temperature sensor signals |

Figure 1:
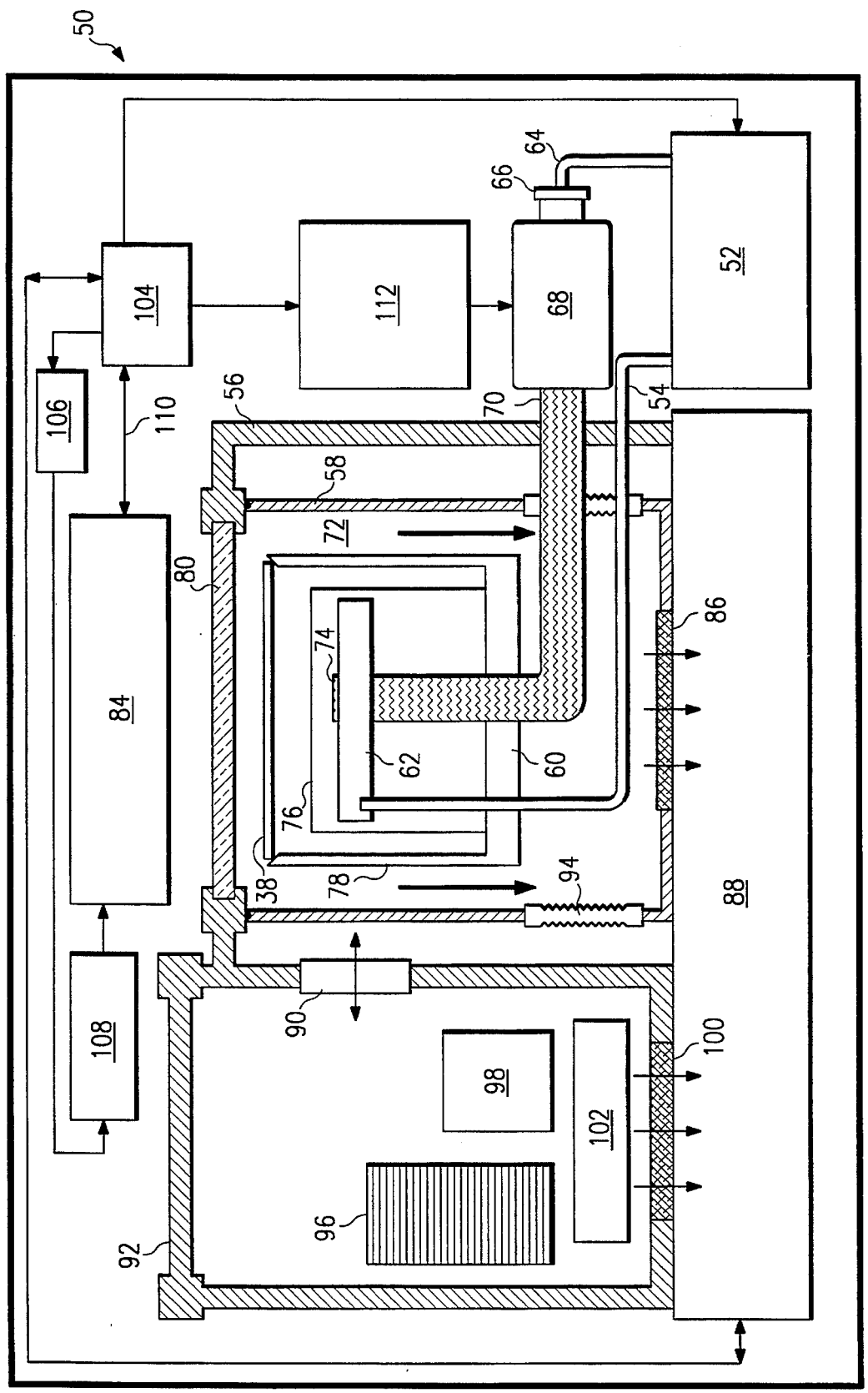
FIG. 1 is a schematic representation of a typical environment of the preferred embodiment, a single-wafer semiconductor fabrication reactor, such as a rapid thermal processing (RTP) reactor.

FIG. 1 shows an example of a Rapid Thermal Processing (RTP) reactor in which the present GPD process can be utilized, which establishes a typical environment of the present invention. The GPD processes of this invention may be performed in rapid thermal processing (RTP) reactors at process temperatures below 1100° C. Referring to FIG. 1, within a single-wafer RTP reactor 50 such as an Automated Vacuum Processor (AVP), may reside semiconductor wafer 38. Beginning at the bottom right-hand corner of FIG. 1, gas distribution network 52 may comprise two gas manifolds: a non-plasma process gas manifold and a plasma manifold. The gas distribution network 52 contains and distributes the gases discussed in this invention. The non-plasma gas manifold feeds through gas line 54 into reactor casing 56 and process chamber wall 58 to pin support plate 60 and into gas injector 62. The plasma manifold connects through plasma line 64 through connection 66 and into microwave discharge cavity 68. Plasma from microwave discharge cavity 68 feeds through plasma tube 70 which also penetrates reactor casing 56 and process chamber wall 58. Within the process chamber 72, plasma tube 70 passes through pin support plate 60 and through gas injector 62 to plasma output 74. Above quartz jacket assembly 76 and supported by low thermal mass pins 78 appears semiconductor wafer 38. Low thermal mass pins 78 hold semiconductor wafer 38 within process chamber 72.

Process chamber 72 includes optical quartz window 80 through which wafer heating is performed by the multi-zone illuminator assembly 84. In association with tungsten-halogen heating lamp module 84 may be a multi-point temperature sensor (not shown) as described in U.S. Pat. No. 5,156,461 (TI-15188) by Moslehi, et al issued on Oct. 20, 1992 and assigned to Texas Instruments Incorporated. Vacuum pump connection 86 removes flowing process gas and plasma from process chamber 72 and directs them into pumping package 88. Additionally, isolation gate 90 permits passage of semiconductor wafer 38 from vacuum load-lock chamber 92 into process chamber 72. To permit movement of semiconductor wafer 38 into process chamber 72, a vertically moveable bellows or up/down actuator mechanism 94 supports process chamber wall 58.

Within vacuum load-lock chamber 92 appears cassette 96 of semiconductor wafers 38 from which wafer handling robot 98 removes a single semiconductor wafer 38 for processing. To maintain loadlock chamber 92 under vacuum, load-lock chamber 92 also includes vacuum pump connection 100 to pumping package 88. Additionally, scatter sensor 102 may be included in load-lock chamber 92 for determining the surface roughness and reflectance of semiconductor wafer 38 for wafer processing measurements according to U.S. Pat. No. 5,293,216 (TI-15198), Sensor for Semiconductor Device Manufacturing Process Control, issued Mar. 8, 1994.

Process control computer 104 receives the multi-point temperature sensor signals, checks the status of multi-zone illuminator 84 for diagnosis/prognosis purposes, and provides multiple temperature control signals to multi-zone controller 106 in response to temperature readings of multi-point sensors. The multi-zone controller 106 receives measured multi-point temperature sensor outputs as well as the desired wafer temperature set point (from process control computer 104) and delivers suitable power set points to the multizone illuminator assembly power supply 108. Signal lines 110 between process control computer 104 and multi-zone illuminator assembly 84 include signals from multi-point temperature sensors from real-time semiconductor wafer 38 temperature measurements and lamp power readings.

GPD is the most effective when the silicon surface is initially treated using an in-situ cleaning process to remove any native oxide. It is important to make sure the surface is atomically clean, so that there is no residual native oxide to block the gas-phase doping process. The GPD rate at a given temperature is mostly limited by the processes of surface dissociation and desorption of the hydrogen byproducts from the surface to make more sites available for chemisorption of the dopant species.

The present invention, a method for using germanium to improve gas-phase doping, involves adding a germanium-containing gas to the gas-phase doping process environment in order to facilitate hydrogen desorption. A small amount, preferably less than 1000 ppm, and more preferably in the range of 10–20 ppm, of a germanium-containing gas, such as germane ($Ge_2H_4$) may be added to the GPD process environment (e.g., $B_2H_6$, $PH_3$/, or $AsH_3$). These dopant gases may then be combined with a carrier gas, for example, $H_2$. The surface chemisorption, surface dissociation, and solid-state diffusion cycles may be performed in sequential thermal (or thermal and plasma) steps to optimize the GPD process. The use of a germanium-containing gas with the dopant source along with $H_2$ carrier gas (with or without $H_2$ remote plasma exposure cycles used during the surface dissociation cycles) enhances the surface dissociation rate as well as the byproduct (e.g., hydrogen) desorption rate (the latter via the hydrogen removal effect of the germanium-containing compound). A germanium-containing compound such as germane facilitates desorption of the hydrogen reaction byproducts, making more surface sites available for adsorption of dopant source molecules.

TABLE 2

| Germanium-containing Compounds | | |
|---|---|---|
| Germanium Compound | Melting Point (°C.) | Boiling Point (°C.) |
| $GeH_4$ (germane) | −165 | −88.5 |
| $Ge_2H_6$ (digermane) | −109 | 29 |
| $Ge_3H_3$ (trigermane) | −105.6 | 110.5 |
| $GeH_3Br$ (bromo-germane) | −32 | 52 |
| $GeH_3Cl$ (chloro-germane) | −52 | 28 |
| $GeF_3Cl$ (chloro-trifluoro-germane) | −66.2 | −20.63 |
| $GeH_2Br_2$ (dibromo-germane) | −15 | 89 |
| $GeH_2Cl_2$ (dichloro-germane) | −68 | 69.5 |
| $GeCl_2F_2$ (dichloro-difluoro-germane) | −51.8 | −2.8 |
| $GeHCl_3$ (trichloro-germane) | −71 | 75.2 |
| $GeCl_3F$ (trichloro-fluoro-germane) | −49.8 | 37.5 |
| $GeCl_4$ (germanium tetrachloride) | −49.5 | 84 |
| $GeBr_4$ (germanium tetrabromide) | 26.1 | 186.5 |
| $GeHBr$ (tribromo-germane) | −24 | — |

Table 2 shows a partial list of several germanium-containing compounds along with their physical properties (melting and boiling points). These compounds have sufficiently low boiling points so that they can be delivered in the gas-phase form to the GPD process environment using a mass-flow controller or a liquid-source delivery system. A germanium-containing compound, such as one of those in Table 2, may be combined with a dopant source and a carrier gas such as hydrogen, for GPD. The dopant source may comprise a gas, e.g. $AsH_3$, $PH_3$, or $B_2H_6$. The dopant source may also comprise a dopant halide gas from the group shown in Table 3.

TABLE 3

| Dopant Halides and Their Physical Properties | | |
|---|---|---|
| HALIDE | MELTING POINT (°C.) | BOILING POINT (°C.) |
| $AsBr_3$ (arsenic tribromide) | 32.8 | 221 |
| $AsCl_3$ (arsenic trichloride) | −8.5 | 130.2 |
| $AsF_5$ (arsenic pentafluoride) | −80 | −53 |
| $BCl_3$ (boron trichloride) | −107.3 | 12.5 |
| $PBr_3$ (phosphorus | −40 | 172.9 |

TABLE 3-continued

Dopant Halides and Their Physical Properties

| HALIDE | MELTING POINT (°C.) | BOILING POINT (°C.) |
|---|---|---|
| tribromide) | | |
| $PCl_3$ (phosphorus trichloride) | −112 | 75.5 |
| $PCl_2F_3$ | −8 | 10 |
| $PF_5$ (phosphorus pentafluoride) | −83 | −75 |
| $PF_3$ (phosphorus trifluoride) | −151.5 | −101.5 |

The dopant source may also comprise other dopant halide gases such as $(CH_3)_3B$, $(C_2H_5)_3B$, $(OCH_3)_3B$, $[(CH_3)_2N]_2BF$, $(C_3S)_2BCH_3$, $C_6H_5BF_2$, $(CH_3)_2BN$ $(CH_3)_2$, $(CH_3)_2BOCH_3$, $CH_3SB(CH_3)_2$, $(CF_3)_2PH$, $(CF_3)_2PCl$, $(CF_3)_2PCN$, $(CF_3)_2PI$, $CF_3PCl_2$, $(C_2H_5)_2PH$, $(CH_3)_2PH$, $C_2H_5PH_2$, $CH_3PH_2$, $(C_2H_5)_3P$, $CF_3PH_2$, $(CH_3)_3P$, $(CF_3)_3P$, $(CF_3)_3As$, $(C_2F_5)_3As$, $(CH_3)_3As$, $(CF_3AsH_2$, $(C_2H_5)_3As$, $CH_3AsH_2$, $C_2H_5AsH_2$, $(CH_3)_2AsH$, $CH_3AsF_2$, $C_2H_5AsF_2$, $(C_2H_5)_2AsH$, $CF_3AsCl_2$, or $CF_3AsBr_2$. Presence of a halogen species (such as Cl, F, or Br) in the GPD process environment (either in a dopant halide or in a halogen-containing germanium compound) further cleans the semiconductor surface and keeps the surface free of native oxide. (See U.S. patent application filed Aug. 1, 1994 by Moslehi for "Method for Doped Shallow Junction Formation Using Direct Gas-Phase Doping," TI case number T18197.)

The use of a germanium-containing additive accelerates desorption of hydrogen reaction byproducts. Moreover, addition of the germanium-containing compound may result in deposition of a few monolayers of Ge (selectively only on the exposed Si areas). This deposition of Ge results in a more effective incorporation of the dopant atoms via GPD. In addition, the germanium-containing additive provides an in-situ surface cleaning action on the semiconductor surface, due to the selective native oxide removal effect of germanium via a thermally activated surface cleaning process. Thus, a separate pre-GPD in-situ native oxide removal step may be eliminated with the present invention.

Figure 2:
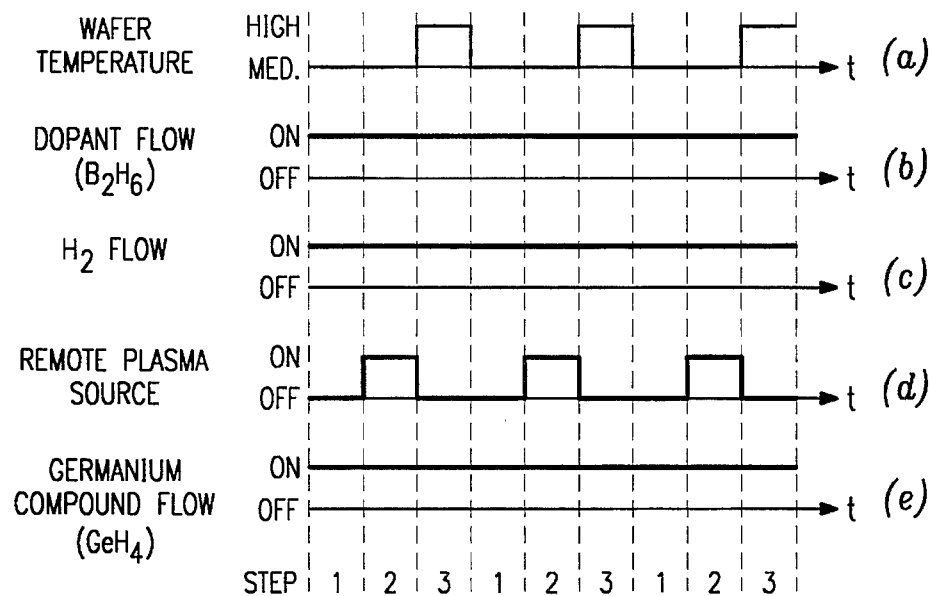
FIG. 2 is a timing diagram for a preferred embodiment of the invention, showing a GPD process with the following parameters: temperature, the dopant source flow rate, the germanium-containing compound gas flow rate, the hydrogen carrier flow rate, and a remote $H_2$ plasma source.
Figure 4:
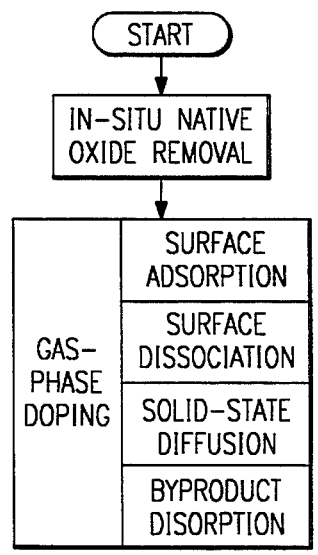
FIG. 4 is a flow diagram depicting the process steps of the invention.

A timing diagram for a preferred embodiment of a GPD process using remote $H_2$ plasma and dopant source with a germanium-containing compound added is shown in FIG. 2. The sequential process shown in FIG. 4 is performed after an in-situ clean in order to remove native oxides. FIG. 2 shows the wafer temperature, the dopant source flow rate, hydrogen carrier flow rate, germanium compound flow rate, and a remote hydrogen plasma source state (e.g. a source of microwave discharge that injects hydrogen plasma into the chamber). Each doping cycle is a three-step process, with the steps described below:

Step 1) A low-to-medium temperature dopant chemisorption step, where the wafer temperature is at a medium setting, the dopant source and germanium-containing compound additive flow rates are on, the hydrogen flow is on, but the remote plasma source is off.

Step 2) A low-to-medium temperature surface dissociation and desorption of byproduct step with an option of remote plasma excitation for $H_2$ carrier gas, where the wafer temperature is medium, the dopant source and germanium-containing compound additive flow rates are on, the hydrogen flow is on, and the remote hydrogen plasma source is on. The reaction results in some chemisorption of dopant species on the surface; and Step 3) A higher temperature (e.g. via radiant heating) solid-state diffusion step to drive the dopant atoms into silicon.

These 3-step GPD cycles may be repeated as many times as desired, in order to obtain more doping concentration or deeper junctions. The GPD methods of the present invention may also be used without the use of a remote plasma source and without the use of temperature cycling. Moreover, when a halogen-containing dopant source or a halogen-containing germanium compound is used in the GPD process, the separate in-situ cleaning process may be deleted.

The novel use of a germanium-containing compound additive for use with GPD chemistries offers definite advantages over the conventional GPD processes based only on $B_2H_6/H_2$, $PH_3/H_2$, or $AsH_3/H_2$. The germanium-containing compound leaches out hydrogen from the surface, making more surface sites available for chemisorption of additional reactive dopant source molecules. Moreover, addition of a germanium-containing compound may result in the deposition of a few monolayers of Ge only on exposed Si areas (not over field oxide or other dielectric layers such as nitride). Deposition of a few monolayers of Ge results in much more effective incorporation of the dopant atoms via GPD. In essence, the germanium-containing compound facilitates hydrogen desorption, resulting in shorter GPD cycle times. The temperature of the process may be reduced, making the junction even shallower for a given surface concentration. With the present invention, the junction depth may be reduced, yet still be heavily doped.

The above processes can be performed with purely thermal doping, or with a combination of thermal and plasma; such as the addition of hydrogen plasma. The sequential multiprocessing GPD process based on the combination of thermal and plasma process energy sources to enhance the chemisorption, surface dissociation, and byproduct desorption processes is also novel and offers potentially significant advantages over the conventional chemistries and methods of GPD.

Figure 3:
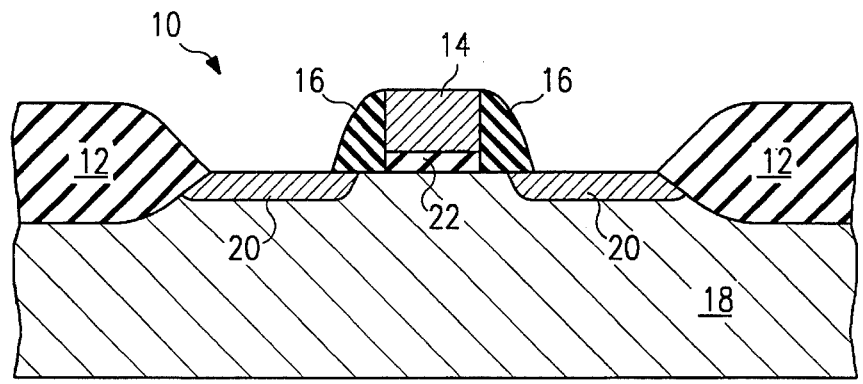
FIG. 3 is a side view of a semiconductor device upon which this process could be used.

FIG. 3 is an example of a structure that benefits from the invention. The substrate 18 is exposed to the gases in the invention, doping it and forming, for example, the p+ source/drain region 20.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for doping semiconductor wafers, comprising the steps of:

providing a semiconductor wafer having a surface; and gas-phase doping said surface of said wafer with a dopant source gas and a doping-assisting germanium-containing compound gas, and wherein said dopant source gas comprises a dopant species.

2. The method of claim 1 wherein said gas-phase doping includes a carrier gas.

3. The method of claim 2 wherein said carrier gas is hydrogen.

4. The method of claim 1 wherein said germanium-containing compound is a material selected from the group consisting of $GeH_4$, $Ge_2H_6$, $Ge_3H_3$, $GeH_3Br$, $GeH_3Cl$, $GeF_3Cl$, $GeH_2Br_2$, $GeH_2Cl_2$, $GeCl_2F_2$, $GeHCl_3$, $GeCl_3F$, $GeCl_4$, $GeBr_4$, and $GeHBr_3$.

5. The method of claim 4 wherein said germanium-containing compound gas is germane.

6. The method of claim 5 wherein the amount of said germane partial pressure in said process medium is less than 1000 ppm.

7. The method of claim 4 wherein said germanium-containing compound gas is digermane.

8. The method of claim 7 wherein the amount of said digermane partial pressure in said process medium is less than 1000 ppm.

9. The method of claim 1 wherein said method is conducted in a thermal processing reactor.

10. The method of claim 9 wherein said thermal processing reactor is a rapid thermal processing equipment.

11. The method of claim 1 and further comprising, after said gas-phase doping step, the steps of:

providing a rapid thermal heating cycle using a heating lamp;

utilizing said rapid thermal heating cycle to diffuse said dopant species into said wafer, whereby a shallow doped region is provided.

12. The method of claim 11 wherein said rapid thermal heating cycle heats the wafer to a temperature between 650° C. and 1150° C.

13. The method of claim 1 wherein said gas-phase doping step is performed after an in-situ semiconductor surface cleaning process, thereby removing the surface native oxide.

14. The method of claim 1 wherein said dopant source gas is a material selected from the group consisting of $B_2H_6$, $BCl_3$, $(CH_3)_3B$, $(C_2H_5)_3B$, $(OCH_3)_3B$, $[(CH_3)_2{}^N]_2BF$, $(C_3S)_2BCH_3$, $C_6H_5BF_2$, $(Ch_3)_2BN$ $(CH_3)_2$, $(CH_3)_2BOCH_3$, and $CH_3SB$ $(CH_3)_2$ in order to dope said semiconductor wafer with p type doping, wherein said dopant species is boron.

15. The method of claim 1 wherein said dopant source gas is a material selected from the group consisting of $PH_3$, $PBr_3$, $PCl_3$, $PCl_2F_3$, $PF_5$, $PF_3$, $(CF_3)_2PH$, $(CF_3)_2PCl$, $(CF_3)_2PCN$, $(CF_3)_2PI$, $CF_3PCL_2$, $(C_2H_5)_2PH$, $(CH_3)_2PH$, $C_2H_5PH_2$, $CH_3PH_2$, $(C_2H_5)_3P$, $CF_3PH_2$, $(CH_3)_3P$, and $(CF_3)_3P$ in order to dope said semiconductor wafer with n type doping, wherein said dopant species is phosphorus.

16. The method of claim 1 wherein said dopant source gas is a material selected from the group consisting of $AsH_3B$, $AsBr_3B$, $AsCl_3B$, $AsF_5$, $(CF_3)_3As$, $(C_2F_5)_3As$, $(CH_3)_3AS$, $CF_3AsH_2$, $C_2H_5)_3As$, $CH_3AsH_2$, $C_2H_5AsH_2$, $(CH_3)_2AsH$, $CH_3AsF_2$, $C_2H_5AsF_2$, $(C_2H_5)_2AsH$, $CF_3AsCl_2$, and $CF_3AsBr_2$ in order to dope said semiconductor wafer with n type doping, wherein said dopant species is arsenic.

17. A method for doping semiconductors wafers, comprising the steps of:

providing a semiconductors wafer having a surface;

gas-phase doping said surface of said wafer with a doping-assisting germanium-containing compound gas and a dopant source gas, wherein said dopant source gas comprises a dopant species; and exposing said wafer, said germanium-containing compound gas and said dopant source gas to a plasma source.

18. The method of claim 17 wherein said gas-phrase doping includes a carries gas.

19. The method of claim 18 wherein said carrier gas is hydrogen.

20. The method of claim 17 wherein said germanium-containing compound is a material selected from the group consisting of $GeH_4$, $Ge_2H_6$, $Ge_3H_3$, $GeH_3Br$, $GeH_3Cl$, $GeF_3Cl$, $GeH_2Br_2$, $GeH_2Cl_2$, $GeCl_2F_2$, $GeHCl_3$, $GeCl_3F$, $GeCl_4$, $GeBr_4$, and $GeHBr_3$.

21. The method of claim 20 wherein said germanium-containing compound gas is germane.

22. The method of claim 21 wherein the amount of said germane partial pressure in said germanium-containing compound gas is less than 1000 ppm.

23. The method of claim 17 wherein said germanium-containing compound gas is digermane.

24. The method of claim 23 wherein the amount of said digermane partial pressure in said germanium-containing compound gas is less than 1000 ppm.

25. The method of claim 17 further comprising, after said exposing to a plasma source step, the steps of:

providing a rapid thermal heating cycle using a heating lamp; and utilizing said rapid thermal heating cycle to diffuse said dopant species into said wafer, whereby a shallow, doped region is provided.

26. The method of claim 17 further comprising, during said exposing to a plasma source step, the steps of:

providing a rapid thermal heating cycle using a heating lamp; and utilizing said rapid thermal heating cycle to diffuse said dopant species into said wafer, whereby a shallow, doped region is provided.

27. A method for doping semiconductor wafers, comprising the steps of:

providing a semiconductor wafer having a surface;

gas-phrase doping said surface of said wafer with a doping-assisting germanium-containing compound gas and a dopant source gas;

exposing said wafer, said germanium-containing compound gas and said dopant source gas to a plasma source; and heating said wafer in a thermal processing equipment.

28. The method of claim 27 wherein said gas-phase doping includes a carrier gas.

29. The method of claim 28 wherein said carrier gas is hydrogen.

30. The method of claim 27 wherein said germanium-containing compound gas is a material selected from the group consisting of $GeH_4$, $Ge_2H_6$, $Ge_3H_3$, $GeH_3Br$, $GeH_3Cl$, $GeF_3Cl$, $GeH_2Br_2$, $GeH_2Cl_2$, $GeCl_2F_2$, $GeHCl_3$, $GeCl_3F$, $GeCl_4$, $GeBr_4$, and $GeHBr_3$.

31. The method of claim 30 wherein said germanium-containing compound gas is germane.

32. The method of claim 31 wherein the amount of said germane partial pressure in said germanium-containing compound gas is less than 1000 ppm.

33. The method of claim 30 wherein said germanium-containing compound gas is digermane.

34. The method of claim 33 wherein the amount of said digermane partial pressure in said germanium-containing compound gas is less than 1000 ppm.

* * * * *